United States Patent
Chen

(10) Patent No.: US 6,808,984 B1
(45) Date of Patent: Oct. 26, 2004

(54) METHOD FOR FORMING A CONTACT OPENING

(75) Inventor: Meng-Hung Chen, Taoyuan (TW)

(73) Assignee: Nanaya Technology Corporation, Taoyuan (TW)

(*) Notice: Subject to any disclaimer, the term of this patent is extended or adjusted under 35 U.S.C. 154(b) by 0 days.

(21) Appl. No.: 10/802,552

(22) Filed: Mar. 17, 2004

(30) Foreign Application Priority Data

Sep. 18, 2003 (TW) ........................ 92125705 A

(51) Int. Cl.[7] ........................................ H01L 21/8242
(52) U.S. Cl. ...................... 438/256; 438/399; 438/637; 438/639; 438/666; 438/671; 438/672; 438/770; 438/787; 438/948; 438/950
(58) Field of Search ................................ 438/256, 399, 438/637, 639–641, 666, 669, 671–672, 762, 765, 770–772, 774, 782, 787, 906, 947–950

(56) References Cited

U.S. PATENT DOCUMENTS

| | | | | |
|---|---|---|---|---|
| 5,565,376 A | * | 10/1996 | Lur et al. ................... | 438/427 |
| 6,146,940 A | * | 11/2000 | Hong ......................... | 438/253 |
| 6,239,011 B1 | * | 5/2001 | Chen et al. ................. | 438/595 |
| 6,524,964 B2 | * | 2/2003 | Yu .............................. | 438/736 |
| 2003/0003756 A1 | * | 1/2003 | Yu .............................. | 438/706 |

* cited by examiner

Primary Examiner—Lynne A. Gurley
(74) Attorney, Agent, or Firm—Quintero Law Office

(57) ABSTRACT

A method for forming a contact opening is provided. After forming transistors on a substrate, a stacked resist layer including a resist layer without a silicon element and a resist layer with a silicon element covers the transistors and the substrate. The stacked resist layer is defined to cover a region of a contact opening to be formed as a mask. A selective growth process, such as a liquid phase oxide deposition (LPOD), is carried out to form a selective silicon oxide layer on the silicon-containing surface and fills the space between the stacked resist layer. After the stacked resist layer is removed, a contact opening is formed in the silicon oxide layer and a step of the etching process is eliminated.

20 Claims, 5 Drawing Sheets

METHOD FOR FORMING A CONTACT OPENING

BACKGROUND OF THE INVENTION

1. Field of the Invention

The present invention relates in general to a semiconductor process. In particular, the present invention relates to a method of using an image resist acting as a sacrificial layer for an inter-level dielectrics (ILD), and forming a contact opening in inter-level dielectrics (ILD) without etching.

2. Description of the Related Art

As ICs become more compact, semiconductor designs have reduced device dimensions. For example, the 64 M DRAM process has shifted from 0.35 μm to 0.3 μm or less, and the 128 M and 256 M DRAM process to less than 0.2 μm.

In the contact process of the array area of a memory unit, the transistor arranges with high density, so a self-aligned contact (SAC) process is typically employed to enhance precision and accuracy. First, the (boro-phosphosilicate glass (BPSG), tetracthoxysilane (TEOS) stacked layers, and the silicon oxide materials, are used to as an inter-level dielectrics (ILD, the insulator layer) covering the transistors, then a SAC bit line contact (CB holes) is formed in the insulator layer using an etching process, the polysilicon material is then filled into the bit line contact to serve as a bit line contact plug. Subsequently, a contact holes process is carried out in the array area which a gate electrode contact (CG holes) and a junction contact (CS contact) are formed in the above insulator layer. Next, the bit line conductive wire MO is etched to define the contact location of the bit line contact plug.

When the ILD is etched, the BPSG/TEOS insulator layer is etched through to expose junction area, exposing the silicon substrate to potential damaged, which results in a serious sub-threshold voltage (sub-Vt) problem, impacting the memory ability of the capacitor in the array area. Additionally, when the ILD is etched, the spacers on the sidewall of the gate electrodes (word line) are easily damaged, resulting in short circuits between word line and bit line. Moreover, when a semiconductor design has reduced device dimensions, the width between the gate electrodes is reduced, impeding the etching process, and resulting in open circuits.

FIGS. 1~2 show the conventional self-aligned contact fabrication resulting in bit line open circuits or word line/bit line short circuits.

Subsequently, in FIG. 1, the pad silicon nitride layer 28, the BPSG layer 30, and the TEOS 32 stacked insulator layer are formed on the silicon substrate 10 with the transistor structure, wherein the pad silicon nitride layer 28 is employed to prevent the B+/P+ of the BPSG layer 30 diffusing to the silicon substrate 10 when a thermal process is performed, impacting the device characteristics. The transistor includes source 12, drain 14 and gate structure 20, the gate structure 20 includes gate oxide layer 21, polysilicon layer 22, tungsten silicon layer 23, silicon nitride layer 24 and silicon nitride spacer 25, on the sidewall of the gate structure 20, wherein the gate electrode consists of the polysilicon layer 22 and the tungsten silicon layer 23. Next, a resist layer 40 is formed on the TEOS layer 32, with a contact opening pattern, then, using the resist layer 40 as a mask, the BPSG layer 30/TEOS layer 32 is etched to form a contact opening 34. Since the contact opening 34 widths of the exposed drain area 14 between the gate electrodes are less than 0.030 μm when the line width is minimized to about 0.09 μm, and, the BPSG layer 30/TEOS layer 32 stacked insulator layer is very thick, the ILD is more difficult to etch when closer to drain area 14, and once the etching reaction is complete, incomplete or unetched insulator residue 30' remains in the bottom of the contact opening 34, preventing exposure of the drain area 14. When the insulator residue 30' is not a conductor, the subsequently filled conductive material cannot be electrically connected, resulting in the described bit line contact open circuits.

In order to prevent open circuits, in FIG. 2, a conventional method uses overetching to etch the insulator residue 30' and the pad silicon nitride layer 28, however, the etching selectivity of the silicon oxide material to the silicon nitride spacer is only around 10~15, and the silicon nitride layer 24 and the silicon nitride spacer 25 are easily removed, exposing the tungsten silicon 23 and polysilicon 22 of the gate electrodes, resulting in word-line/bit-line short circuits Additionally, BPSG possesses excellent gap filling characteristics even if the line width is reduced to 0.09 or 0.07 μm; however, the width between the gate electrodes is minimized when the line width dimension is reduced, such that the gap between the gate electrodes is difficult to fill even with BPSG material, resulting in voids and leading to short circuits between the adjacent contacts of the individual bit lines. Different from FIGS. 1 and 2, FIG. 3 shows that the two drains 14 are a portion of the transistor of the individual bit line. After etching the BPSG 30 and TEOS 32 stacked insulator layer to form a contact opening 34 using resist layer 40 as a mask, the resist layer 40 is then removed. Next, the contact opening 34 is filled with conductive material to form bit line contact plug 38. Once the contact opening 34 forms void 36, the conductive material is also filled into the void 36, resulting in short circuits between contact plugs 38 of adjacent bit lines.

SUMMARY OF THE INVENTION

Accordingly, an object of the invention is to provide a method of forming a contact opening, and preventing the silicon substrate from damage during, for example, bit line contact etching.

Another object of the invention is to provide a method of forming a contact opening, and preventing the contact from open circuits due to narrow width between the gate electrodes.

Another object of the invention is to provide a method of forming a contact opening, and preventing word line/bit line from short circuits.

Another object of the invention is to provide a bit line contact process, and preventing contact plugs from short circuits due to the voids in the inter layer dielectric (ILD).

In order to achieve the above objects, the invention provides a method of forming a contact opening, comprising providing a substrate with transistors protected by a silicon-containing insulator layer, then, covering a non-silicon-containing resist layer on the substrate, with a level surface, next, covering a silicon-containing thin resist layer on the non-silicon-containing resist layer to form a stacked resist layer, with a level surface, patterning the stacked resist layer to form a resist stacked layer with a contact plug pattern overlying the doping areas, next, forming an insulator layer on the resist unmasked area using a selective deposition process, removing the stacked resist layer to expose the doping area, and forming a contact opening.

DESCRIPTION OF THE DRAWINGS

For a better understanding of the present invention, reference is made to a detailed description to act as read of conjunction with the accompanying drawings, in which.

DETAILED DESCRIPTION OF THE INVENTION

In this specification, "overlying the substrate", "above the layer", or "on the film" denote a relative positional relationship with respect to the surface of the base layer, regardless of the existence of intermediate layers. Accordingly, these expressions may indicate not only the direct contact of layers, but also, a non-contact state between one or more laminated layers.

Figure 1:
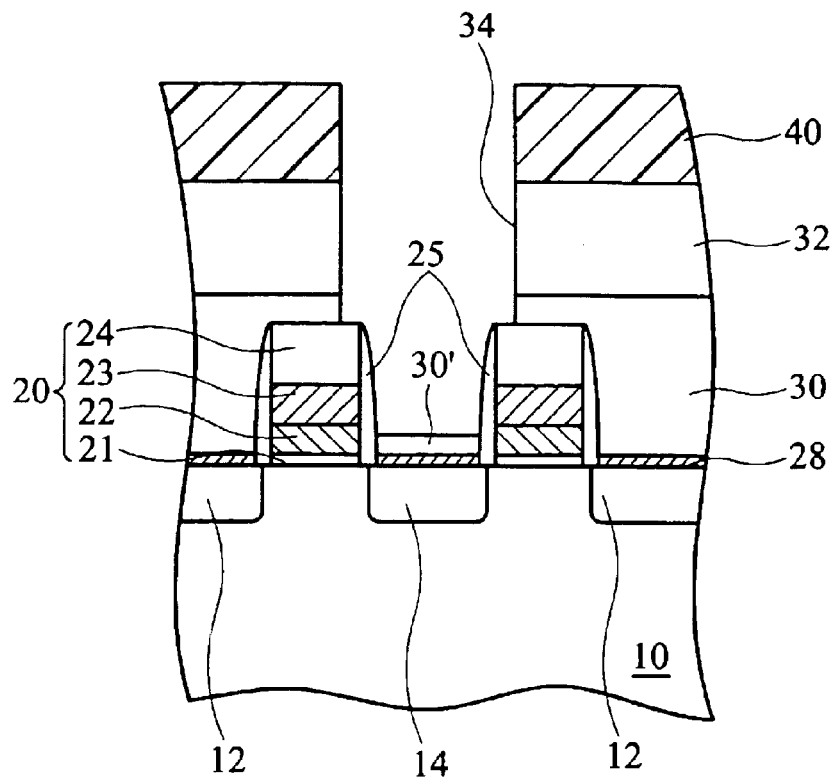
FIG. 1 is a cross section of the bit line open circuits in the conventional bit line contact process.
Figure 2:
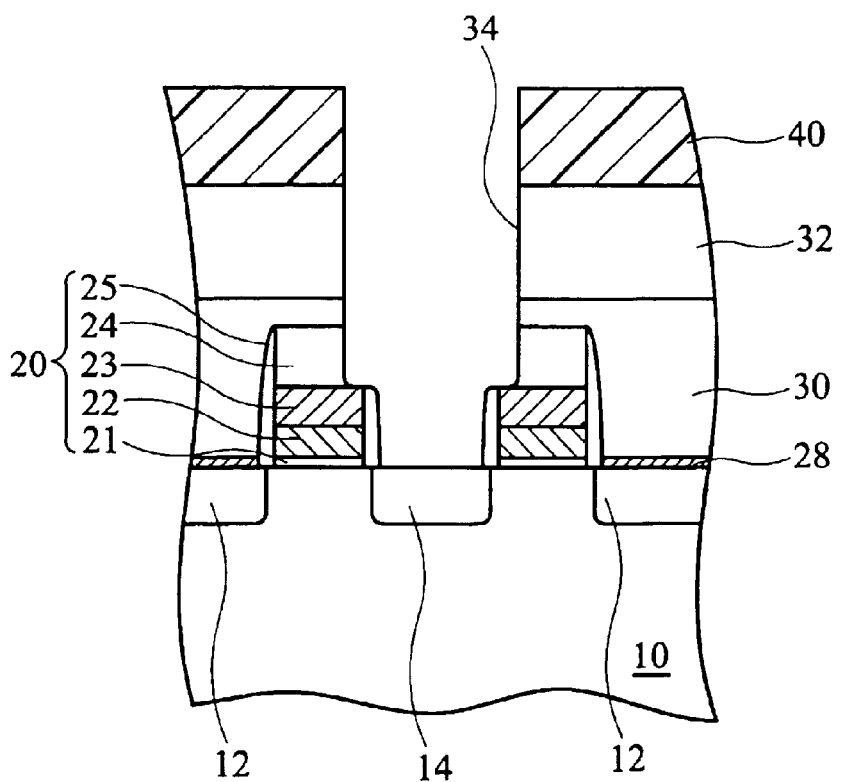
FIG. 2 is a cross section of the word-line/bit-line short circuits in the conventional bit line contact process.
Figure 3:
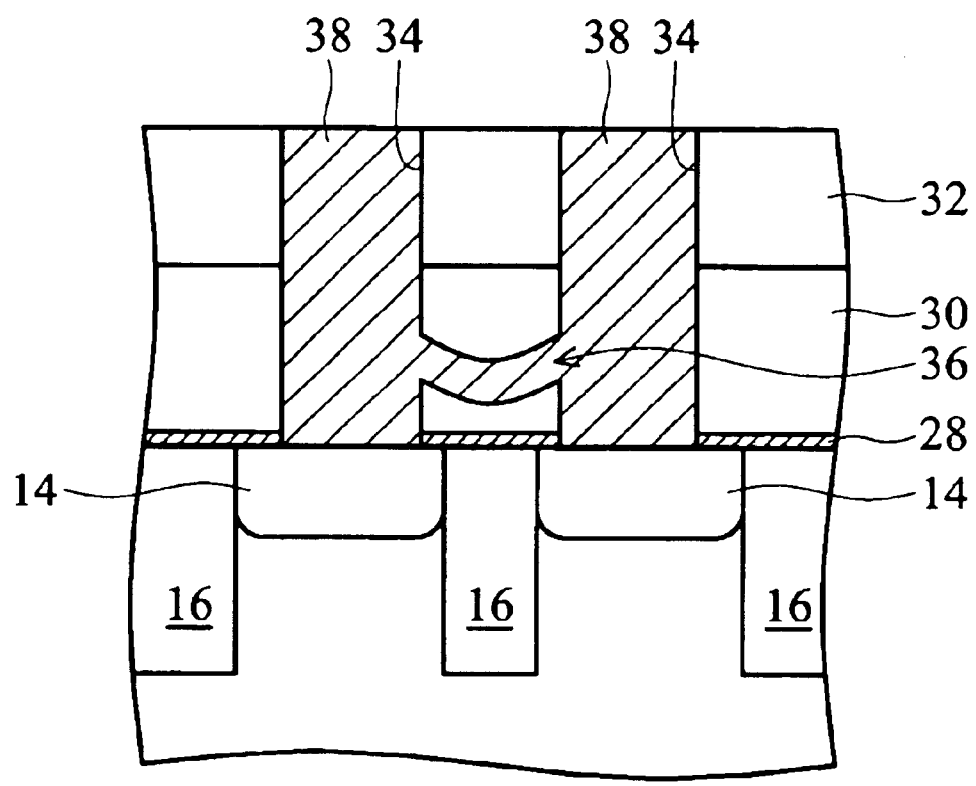
FIG. 3 is a cross section of the short circuits between contacts of the adjacent bit line in the conventional bit line contact process.
Figure 4A:
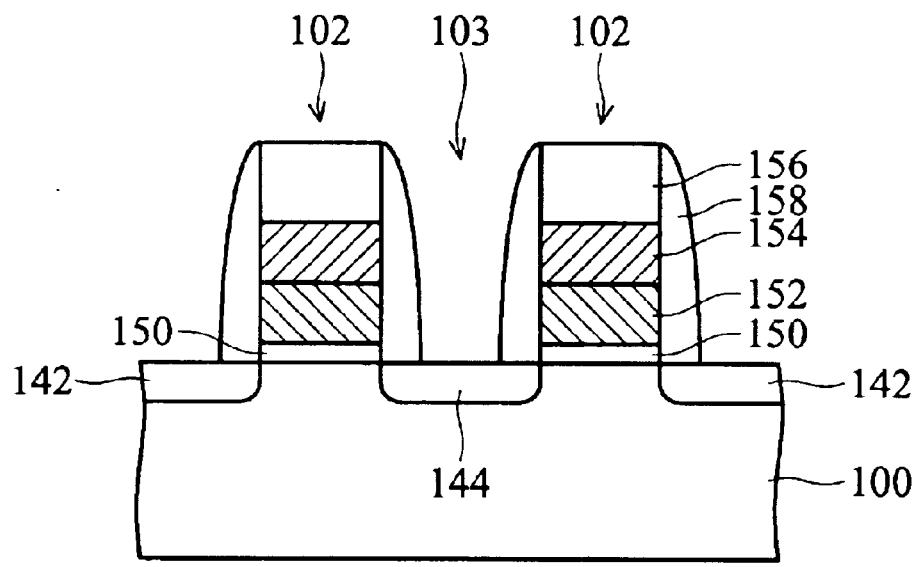
FIGS. 4A–4F are cross sections of the method of forming the bit line contact opening according to the present invention.

In FIG. 4A, a semiconductor substrate 100, such as a single crystal substrate, is provided with a transistor 102 thereon, the transistor consists of source 142, drain 144, gate insulator layer 150, polysilicon layer 152, metal silicide layer 154 and mask layer 156. A gate electrode constituted by polysilicon layer 152 and metal silicide layer 154 and covered by an insulating material, capped by a silicon nitride layer as a mask layer 156, with a silicon nitride spacer 158 on the sidewall. That is, a transistor 102 constitutes a gate electrode covered by an insulator material; a drain 142 and a source 144 are the doping area, with a space 103 between the adjacent transistors 102.

In the present invention, since the inter layer dielectric (ILD) uses a non-boron/phosphorous silicon oxide material instead, the space 103 on the exposed semiconductor substrate 100 is not necessarily protected by an additional pad silicon nitride layer, such that the boron/phosphorous of the BPSG is preventing from diffusing to the substrate, thus eliminating a step of the deposition process.

Figure 4B:
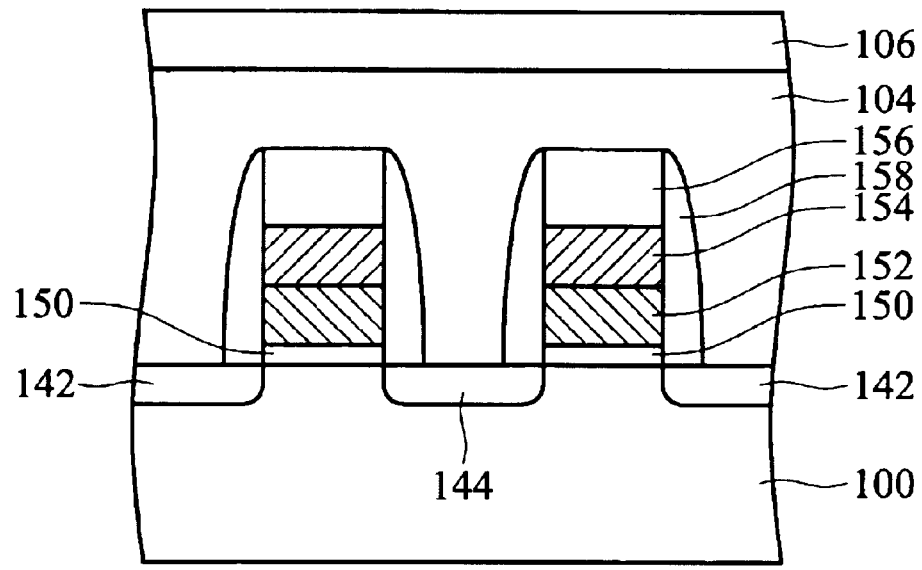

In FIG. 4B, an non-silicon-contained resist layer 104, such as model number NFL1400, produced by JSR Company, is coated on the substrate 100 of the formed transistor 102, with a thickness of about 4000~8000 Å and a level surface, then, a silicon-containing thin image resist layer 106 is coated on the non-silicon-containing resist layer 104, with a thickness of about 500~4000 Å (optimal is 800~2000 Å) and a level surface to obtain an optimal resolution after deep ultraviolet light (DUV) exposure and a development process.

Figure 4C:
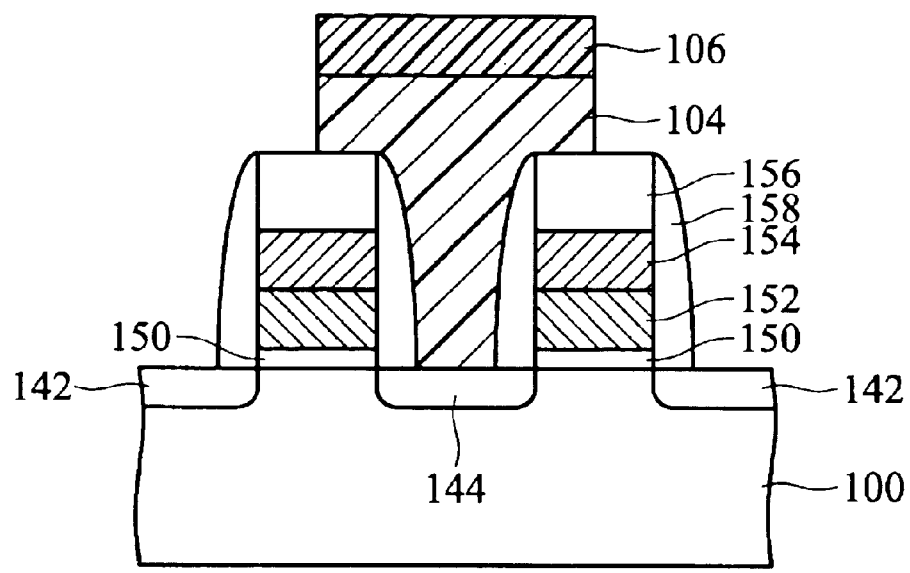

In FIG. 4C, after deep ultraviolet light (DUV) exposure, with a light source such as ArF 193 nm or KrF 248 nm, the pattern of the bit line contact is defined on the silicon-containing resist layer 106. Subsequently, using the patterned image resist layer 106 as a mask, the non-silicon-containing resist layer 104 thereunder unmasked by image resist layer 106 is removed using an etching process, such as $SO_2/O_2$ etching, exposing the non-bit-line-contact area with a silicon-containing surface, such as a silicon substrate surface.

Figure 4D:
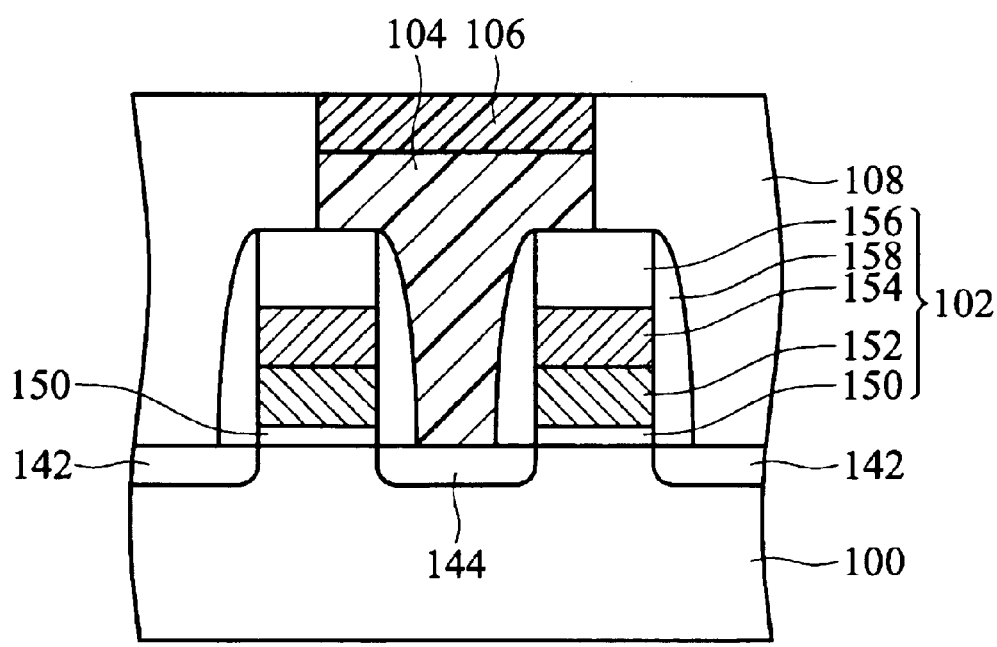

In FIG. 4D, a silicon oxide layer is deposited on the silicon substrate surface using liquid phase oxide deposition (LPOD), layer by layer, the gaps between the resist stacked layer 104/106 are filled to form a silicon oxide layer 108, with a thickness of about 5000~8000 Å depending on the real depth of the M0 bit line.

The process of the liquid phase oxide deposition (LPOD), for example, is to immerse the surface of the substrate in hexafluorosilicic acid ($H_2SiF_6$) solution, and adding boric acid ($H_3BO_3$), the reaction formulas are as follows:

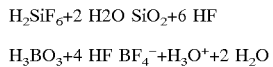

$H_3BO_3 + 4 HF \rightarrow BF_4^- + H_3O^+ + 2 H_2O$

Another method is to immerse the surface of the substrate in $H_2SiF_6$ and $NH_3$ solutions, the reaction formulas are as follows:

$H_2SiF_6 + 2 NH_3 \rightarrow (NH_4)_2SiF_6$

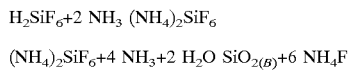

The above mentioned liquid phase oxide deposition (LPOD) processes are exemplary and are not restricted thereto. Other liquid phase oxide deposition (LPOD) processes can be used instead.

Figure 4E:
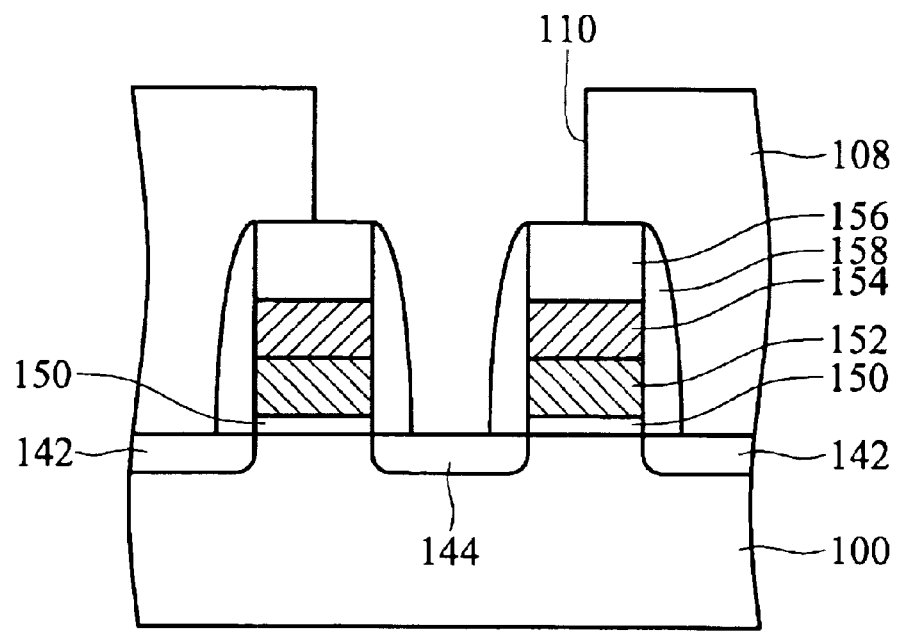

Next, in FIG. 4E, the resist stacked layers 104 and 106 are removed using conventional $O_3$ plasma etching to expose the doping area 144 of the bit line contact, and then cleaned by a $H_2SO_4/H_2O_2/DHF$ mixed acid solution.

Figure 4F:
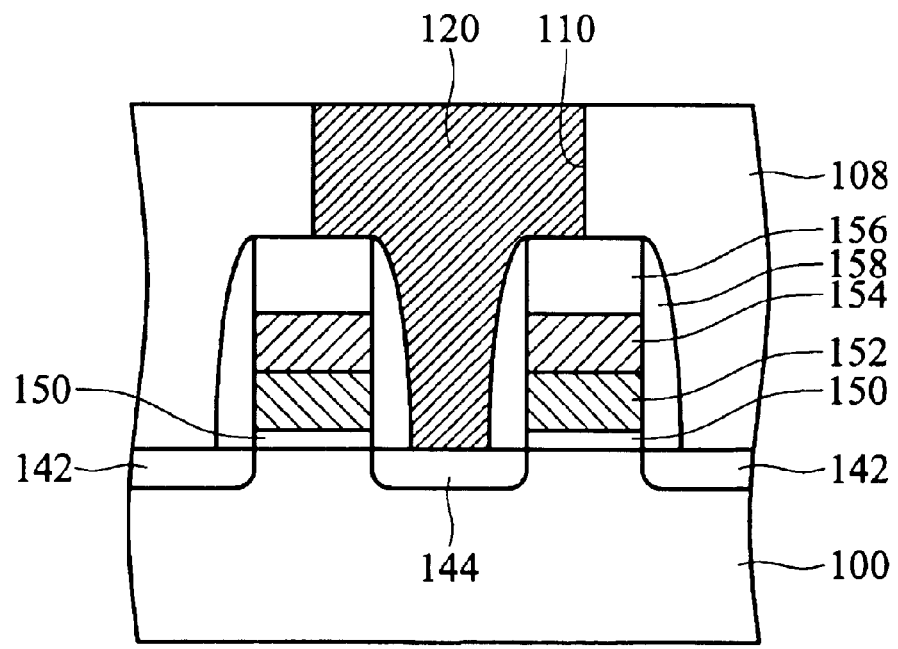

Subsequent to the above process steps, a contact opening 110 for bit line contact is formed in silicon oxide layer 108. Next, in FIG. 4F, a TiN and a Tungsten (W) or polysilicon conductive material are filled sequentially into the contact opening 110, then, the unnecessary portion of the conductive material is removed using chemical mechanical polishing (CMP) to form a bit line contact plug 120 in the contact opening 110.

The invention of forming a contact opening uses a lithography process to first mask the area of the bit line contact, then forms the silicon oxide layer on the surface of the silicon oxide and silicon using selective deposition, eliminating an etching process step and preventing damage to the silicon from an etching process, such as overetching which resulting in word line/bit line short circuits; or incomplete etching which results in bit line open circuits; as well as preventing void formation in the ILD.

Moreover, the invention uses ILD without boron/phosphorous, therefore, the pad silicon nitride layer need not be protected from boron/phosphorous diffusion, thus eliminating a process step of the pad silicon nitride deposition.

Although the present invention has been particularly shown and described above with reference to the preferred embodiment, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of forming a contact opening comprising the steps of:

providing a substrate having a transistor thereon, each comprising a gate electrode and doping areas, the gate electrode is protected by a silicon-containing insulator layer;

coating a non-silicon-containing resist layer on the substrate of the transistor, with a level surface;

coating a silicon-containing resist layer on the non-silicon-containing resist layer, with a level surface;

patterning the silicon-containing resist and the non-silicon-containing resist layer to form a resist stacked layer with a contact plug pattern overlying the doping areas;

forming an insulator layer using a selective deposition process on the substrate unmasked by the resist stacked layer; and removing the resist stacked layer to expose the doping area, forming a contact opening.

2. The method of claim 1, wherein the silicon-containing insulator layer is silicon nitride.

3. The method of claim 1, wherein a thickness of the non-silicon-containing resist layer is 4000~8000 Å.

4. The method of claim 1, wherein a thickness of the silicon-containing resist layer is 500~4000 Å.

5. The method of claim 1, wherein the method of patterning the non-silicon-containing resist layer and the silicon-containing resist layer comprising the steps of:

patterning the silicon-containing resist layer using a lithography process; and using the silicon-containing resist layer as a mask, etching the non-silicon-containing resist layer thereunder.

6. The method of claim 5, wherein the method of etching the non-silicon-containing resist layer comprises using $SO_2/O_2$ as etching gases.

7. The method of claim 1, wherein the selective deposition process is liquid phase oxide deposition (LPOD).

8. The method of claim 7, wherein the process of the liquid phase oxide deposition comprises immersing the substrate surface in $H_2SiF_6$ solution with $H_3BO_3$.

9. The method of claim 7, wherein the process of the liquid phase oxide deposition comprises immersing the substrate surface in $H_2SiF_6$ and $NH_3$ solution.

10. The method of claim 1, further comprising:

filling a metal material into the contact opening of the insulator layer to form a contact plug.

11. A method of forming a contact opening comprising the steps of:

providing a substrate having a device thereon, the device is protected by a silicon-containing insulator layer, with a doping area;

coating a non-silicon-containing resist layer on the substrate of the device and the doping area, with a level surface;

coating a silicon-containing resist layer on the non-silicon-containing resist layer, with a level surface;

patterning the silicon-containing resist layer and the non-silicon-containing resist layer to form a resist stacked layer with a contact plug pattern overlying the doping areas, the surface unmasked by the resist stacked layer comprises a portion of the silicon-containing insulator layer, a silicon and/or silicon oxide material;

forming an insulator layer using a selective deposition process on the surface of the silicon and/or silicon oxide material; and removing the resist stacked layer to expose the doping area, forming a contact opening.

12. The method of claim 11, wherein the silicon-containing insulator layer is silicon nitride.

13. The method of claim 11, wherein a thickness of the non-silicon-containing resist layer is 4000~8000 Å.

14. The method of claim 11, wherein a thickness of the silicon-containing resist layer is 500~4000 Å.

15. The method of claim 11, wherein the method of patterning the non-silicon-containing resist layer and the silicon-containing resist layer comprising the steps of:

patterning the silicon-containing resist layer using a lithography process; and using the silicon-containing resist layer as a mask, etching the non-silicon-contained resist layer thereunder.

16. The method of claim 15, wherein the method of etching the non-silicon-contained resist layer comprises using $SO_2/O_2$ as etching gases.

17. The method of claim 11, wherein the selective deposition process is liquid phase oxide deposition (LPOD).

18. The method of claim 17, wherein the process of the liquid phase oxide deposition comprises immersing the substrate surface in $H_2SiF_6$ solution with $H_3BO_3$.

19. The method of claim 17, wherein the process of the liquid phase oxide deposition comprises immersing the substrate surface in $H_2SiF_6$ and $NH_3$ solution.

20. The method of claim 11, further comprising:

filling a metal material into the contact opening of the insulator layer to form a contact plug.

* * * * *